United States Patent
Yeh et al.

(10) Patent No.: US 10,965,251 B1
(45) Date of Patent: Mar. 30, 2021

(54) MULTI-MODE PROCESSING CIRCUIT AND MULTI-MODE CONTROLLING METHOD THEREOF

(71) Applicant: RichWave Technology Corp., Taipei (TW)

(72) Inventors: Chiang-Hua Yeh, Taipei (TW); Ching-Piao Liang, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/987,385

(22) Filed: Aug. 6, 2020

(30) Foreign Application Priority Data

Nov. 26, 2019 (TW) .................................. 108143009

(51) Int. Cl.
| | | |
|---|---|---|
| *H03D 7/12* | (2006.01) | |
| *H03M 1/66* | (2006.01) | |
| *H03D 7/14* | (2006.01) | |

(52) U.S. Cl.
CPC .............. *H03D 7/12* (2013.01); *H03D 7/1458* (2013.01); *H03M 1/66* (2013.01)

(58) Field of Classification Search
CPC ............ H03D 7/12; H03D 7/125; H03D 7/14; H03D 7/1425; H03D 7/1458; H03M 1/66
USPC ........................................................ 327/355
See application file for complete search history.

(56) References Cited

U.S. PATENT DOCUMENTS

| | | | |
|---|---|---|---|
| 4,162,452 A | * | 7/1979 | Ash ...................... H03B 5/1847 455/179.1 |
| 10,422,856 B2 | | 9/2019 | Cheung et al. |
| 2007/0046834 A1 | * | 3/2007 | Yamamoto ........... H03D 7/1425 348/731 |
| 2007/0135076 A1 | * | 6/2007 | Holden ..................... H03D 7/14 455/326 |
| 2017/0153279 A1 | * | 6/2017 | Chung ..................... H03D 7/12 |
| 2018/0091098 A1 | * | 3/2018 | Duncan ................. H03D 7/165 |

FOREIGN PATENT DOCUMENTS

| | | |
|---|---|---|
| TW | 448633 | 8/2001 |
| TW | 200303122 | 8/2003 |
| TW | 200713797 | 4/2007 |
| TW | 201041299 | 11/2010 |

* cited by examiner

*Primary Examiner* — William Hernandez
(74) *Attorney, Agent, or Firm* — JCIPRNET

(57) ABSTRACT

A multi-mode processing circuit and a multi-mode controlling method thereof are provided. The multi-mode processing circuit includes, but is not limited to, a control circuit and a mixer. The control circuit is configured to receive an input signal and output one of a control signal and another control signal according to the input signal. The mixer is coupled to the control circuit and is configured to mix the control signal output by the control circuit with another input signal or mix the other control signal with the another input signal to output an output signal. Accordingly, the mixer and a buffer can be integrated into a single cell, and a fast mode switch can be achieved.

20 Claims, 7 Drawing Sheets

MULTI-MODE PROCESSING CIRCUIT AND MULTI-MODE CONTROLLING METHOD THEREOF

CROSS-REFERENCE TO RELATED APPLICATION

This application claims the priority benefit of Taiwan application serial no. 108143009, filed on Nov. 26, 2019. The entirety of the above-mentioned patent application is hereby incorporated by reference herein and made a part of this specification.

BACKGROUND OF THE INVENTION

1. Field of the Invention

The invention relates to a multi-mode integration technology. More particularly, the invention relates to a multi-mode processing circuit and a multi-mode controlling method thereof.

2. Description of Related Art

A mixer and a buffer are common electronic elements in a communication transmitter, a receiver, or a transceiver. It should be noted that both the mixer and the buffer can receive a local oscillation signal provided by a local oscillator (LO). In the existing art, in circuit design, an individual mixer and an individual buffer may be matched with switch circuits, to switch the local oscillation signal for using. However, the existing circuit design requires a relatively large layout area while an entire system consumes more power. In addition, frequent switches between a mixing mode and a buffering mode may result in insertion loss. Therefore, the existing circuit design of integrating the mixer with the buffer still needs to be improved.

SUMMARY OF THE INVENTION

Embodiments of the invention provide a multi-mode processing circuit and a multi-mode controlling method thereof.

The multi-mode processing circuit in the embodiments of the invention includes, but is not limited to, a control circuit and a mixer. The control circuit is configured to receive an input signal and output one of a control signal and another control signal according to the input signal. The mixer is coupled to the control circuit and is configured to mix the control signal output by the control circuit with another input signal or mix the other control signal with the another input signal to output an output signal.

According to another aspect, a multi-mode controlling method in the embodiments of the invention includes, but is not limited to, the following steps. The foregoing multi-mode processing circuit is provided. The multi-mode processing circuit is operated in a mode according to a control signal and is operated in another different mode according to another control signal.

To make the features and advantages of the invention clear and easy to understand, the following gives a detailed description of embodiments with reference to accompanying drawings.

DESCRIPTION OF THE EMBODIMENTS

Figure 1:
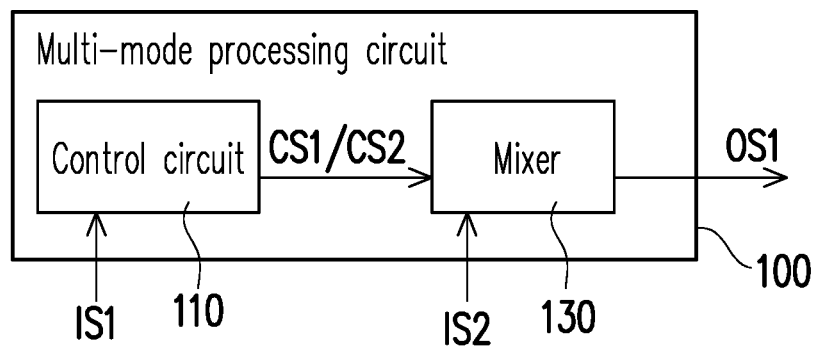
FIG. 1 is a block diagram of elements of a multi-mode processing circuit according to an embodiment of the invention.

FIG. 1 is a block diagram of elements of a multi-mode processing circuit 100 according to an embodiment of the invention. Referring to FIG. 1, the multi-mode processing circuit 100 includes, but is not limited to, a control circuit 110 and a mixer 130. The multi-mode processing circuit 100 could be applied to various types of communication transmitters or transceivers. For example, the multi-mode processing circuit 100 could be disposed in a radar device or a distance measuring device.

The control circuit 110 is configured to receive an input signal IS1. The input signal IS1 could be an alternating current signal of any waveform (for example, a sine wave, a triangular wave, or a square wave), a direct current signal of any waveform or a direct current signal of a fixed amplitude. In an embodiment, the input signal IS1 is a to-be-mixed intermediate frequency (IF) signal. In another embodiment, the input signal IS1 is a direct current bias voltage. In still another embodiment, the input signal IS1 is a coded digital signal.

In addition, the control circuit 110 could selectively output one of a control signal CS1 and a control signal CS2 according to the input signal IS1. In an embodiment, the control circuit 110 could select, according to a mode selection operation, output of the control signal CS1 or the control signal CS2. The mode selection operation could be based on a predetermined trigger condition (for example, a detection result or time related to distance measuring or object detection), or could be based on an input operation performed by a user on an input device (for example, a switch, a keyboard, or a touch panel, etc.). In addition, in an embodiment, the control signal CS1 is a direct current signal while the control signal CS2 is an alternating current signal. It should be noted that selection of a direct current signal or an alternating current signal relates to selection of a mode. The selection of a direct current signal or an alternating current signal is to be described in detail in a subsequent embodiment.

Figure 2A:
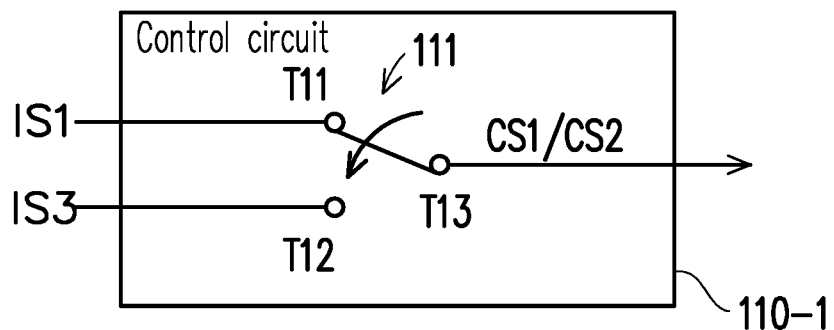
FIG. 2A is a block diagram of elements of a control circuit according to an embodiment of the invention.

There are many variations of the control circuit 110. FIG. 2A is a block diagram of elements of a control circuit 110-1 according to an embodiment of the invention. Referring to FIG. 2A, the control circuit 110-1 includes a control switch 111. An input terminal T11 of the control switch 111 is configured to receive an input signal IS1, an input terminal T12 of the control switch 111 is configured to receive an input signal IS3, and, an output terminal T13 of the control switch 111 is coupled to a mixer 130 and is configured to selectively output one of a control signal CS1 and a control signal CS2.

In an embodiment, the input signal IS1 is an intermediate frequency signal, and the input signal IS3 is a direct current bias voltage (for example, a power supply voltage (VDD) or other fixed voltages). The control circuit 110-1 could be further connected to a control terminal (not shown). The control terminal receives a corresponding control signal (which is related to selection of the input signal IS1 or the input signal IS3) in response to the foregoing mode selection operation, so as to select the input signal IS1 as the control signal CS2 (that is, the control signal CS2 is an intermediate frequency signal) to be output, or select the input signal IS3 as the control signal CS1 (that is, the control signal CS1 is a direct current bias voltage) to be output.

Figure 2B:
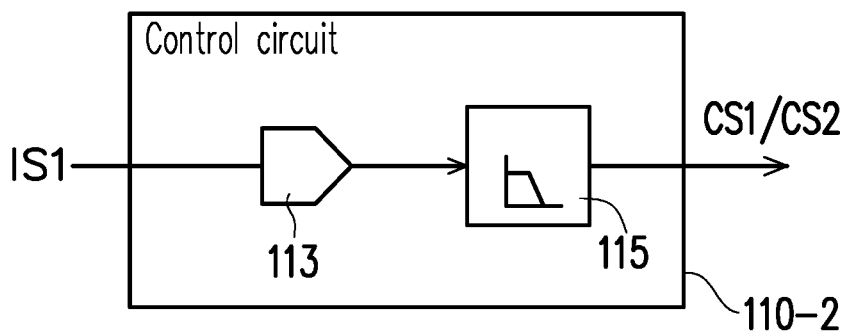
FIG. 2B is a block diagram of elements of a control circuit according to another embodiment of the invention.

FIG. 2B is a block diagram of elements of a control circuit 110-2 according to another embodiment of the invention. Referring to FIG. 2B, the control circuit 110-2 includes a digital-to-analog converter (DAC) 113 and a low pass filter (LPF) 115. The digital-to-analog converter 113 could be implemented by using an N-order (N is a positive integer greater than zero) over-sampling modulator or an N-bit Nyquist frequency sampler. In the present embodiment, the input signal IS1 is a coded digital signal, and the digital-to-analog converter 113 outputs one of the control signal CS1 and the control signal CS2 based on coded content of the input signal IS1. For example, Table (1) is a comparison table between the coded contents and corresponding output voltages of the digital-to-analog converter 113:

TABLE 1

| Coded content | Output terminal 1 (volt) | Output terminal 2 (volt) | Mode |
|---|---|---|---|
| 00 | 0 | 1.2 | Buffering |
| 01 | 0.33 | 1.0 | Mixing |
| 10 | 0.67 | 0.67 | No output |
| 11 | 1.0 | 0.33 | Mixing |

If the coded content is "00", the output signal is a direct current bias voltage of 0 or 1.2 volts (that is, the control signal CS1 in a direct current form). If the coded content is "01", the output signal is an alternating current signal between 0.33 volts and 1 volt (that is, the control signal CS2). If the coded content is "10", the output signal is a direct current bias voltage of 0.67 volts (that is, the control signal CS1 in the direct current form). If the coded content is "11", the output signal is an alternating current signal between 1 volt and 0.33 volts (that is, the control signal CS2). Mode items are to be described in detail in a subsequent embodiment.

It should be noted that the items, values of the items and a quantity of items in Table (1) may vary according to actual requirements, which is not limited in the embodiment of the invention. In addition, Table (1) records two output terminals, wherein one of the two output terminals could be coupled to a mixer 130.

In addition, the low pass filter 115 is coupled to the digital-to-analog converter 113, and performs low pass filter processing on the control signal CS1 or the control signal CS2 output by the digital-to-analog converter 113 to remove noise.

In other embodiments, the control circuit 110 could also be other chips or digital circuits, and is configured to select, according to the mode selection operation, output of only the control signal CS1 or only the control signal CS2.

Referring to FIG. 1, the mixer 130 is coupled to the control circuit 110, for receiving the control signal CS1 or the control signal CS2 output by the control circuit 110, and is configured to mix the control signal CS1 with the input signal IS2 or mix the control signal CS2 with the input signal IS2, so as to output an output signal OS1.

In an embodiment, the input signal IS2 is a clock signal or a local oscillation signal provided by an oscillator (not shown) or another local signal generator. The mixer 130 could mix (through an up conversion) the control signal CS1 or the control signal CS2 according to the clock signal or the local oscillation signal to form a radio frequency signal (that is, the output signal OS1).

Figure 3A:
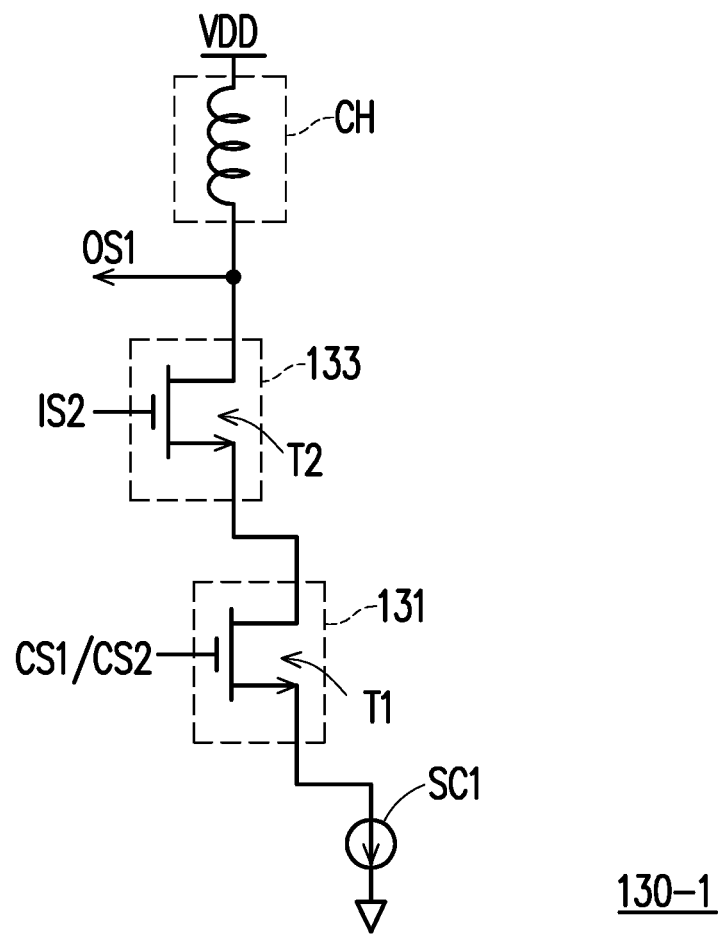
FIG. 3A is a block diagram of elements of a mixer according to an embodiment of the invention.

There could be many variations of the mixer 130. FIG. 3A is a block diagram of elements of a mixer 130-1 according to an embodiment of the invention. Referring to FIG. 3A, the mixer 130-1 includes switch circuits 131 and 133, to thereby form an unbalanced mixer.

The switch circuit 131 includes a transistor T1. A control terminal (for example, a gate) of the transistor T1 is coupled to an output terminal of a control circuit 110 and is configured to receive a control signal CS1 or a control signal CS2. A first end (for example, a source) of the transistor T1 is coupled to a current source SC1 (wherein the other end of the current source SC1 is configured to be coupled to a reference voltage terminal, for example, being grounded), and, a second end (for example, a drain) of the transistor T1 is used as an output terminal of the switch circuit 131. The switch circuit 131 is controlled by one of the control signal CS1 and the control signal CS2 to thereby change a conducting state. For example, the switch circuit 131 could be turned on or turned off, so that one of the control signal CS1 and the control signal CS2 is output or is blocked.

For example, if the control signal CS1 is at a high voltage level, the switch circuit 131 is turned on, so that the switch circuit 131 outputs the control signal CS1 to the switch circuit 133. For another example, when the control signal CS2 in an alternating current form is inputted to the switch circuit 131, the conducting state of the switch circuit 131 could thereby be dynamically controlled, for example, be turned on or turned off. For further another example, if the control signal CS1 is at a low voltage level (that is, an electric potential of a reference voltage, for example, a ground potential), the switch circuit 131 is turned off, so that the switch circuit 131 has no output.

The switch circuit 133 includes a transistor T2. A control terminal (for example, a gate) of the transistor T2 is configured to receive an input signal IS2. A first end (for example, a source) of the transistor T2 is coupled to the output terminal of the switch circuit 131, and a second end (for example, a drain) of the transistor T2 is used as an output terminal of the switch circuit 133. The switch circuit 133 is controlled by the input signal IS2 to change a conducting state. For example, the switch circuit 133 could be turned on or turned off, so that one of the control signal CS1 and the control signal CS2 passes or is blocked, thereby achieving mixing. The switch circuit 133 could mix (for example, being operated in a mixing mode) the control signal CS1 output by the switch circuit 131 with the input signal IS2, or mix the control signal CS2 with the input signal IS2, to form an output signal OS1.

If the switch circuit 133 receives the control signal CS1, a carrier frequency of the output signal OS1 could be a sum of carrier frequencies of the control signal CS1 and the input signal IS2. In an embodiment, if the control signal CS1 is a direct current signal, then the carrier frequency of the output signal OS1 is equivalent to the carrier frequency of the input signal IS2, and the mixer 130 could be used as a buffer (for example, being operated in a buffering mode).

In addition, if the switch circuit 133 receives the control signal CS2, then the carrier frequency of the output signal OS1 could be a sum of carrier frequencies of the control signal CS2 and the input signal IS2. In an embodiment, the control signal CS2 is an alternating current signal having a specific periodic characteristic (for example, an intermediate frequency signal of a sine wave or a signal of other waveforms), and the output signal OS1 hence forms a radio frequency signal.

In an embodiment, the multi-mode processing circuit 100 further includes a choke (CH). An end of the choke (CH) is coupled to an output terminal of the mixer 130-1 (for example, the output terminal of the switch circuit 133), and an another end of the choke receives a power supply voltage (VDD) or other fixed voltages. The choke (CH) could be configured to reduce or filter out noise interference.

Figure 3B:
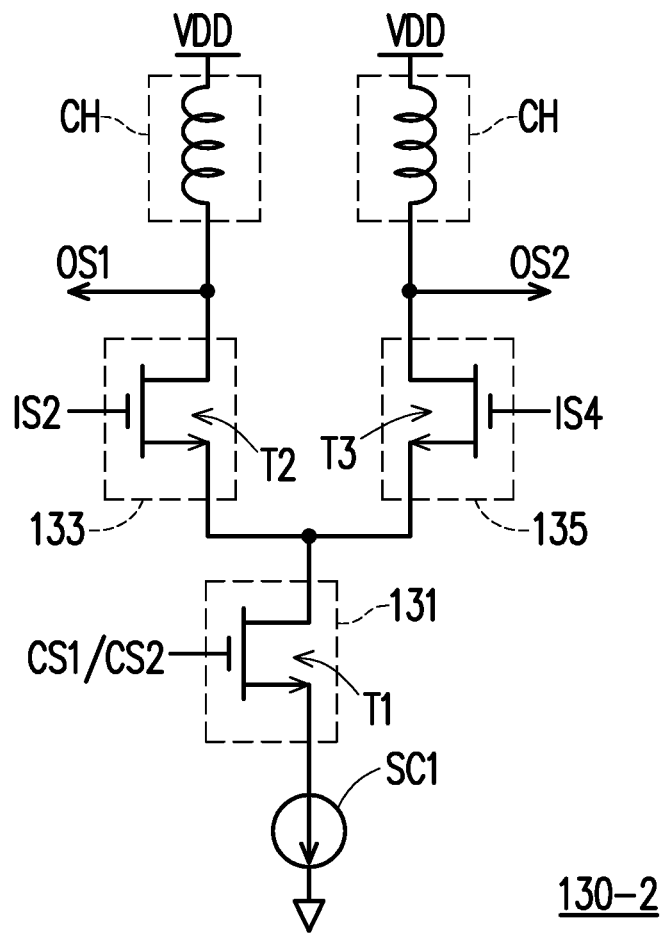
FIG. 3B is a block diagram of elements of a mixer according to another embodiment of the invention.

FIG. 3B is a block diagram of elements of a mixer 130-2 according to another embodiment of the invention. Referring to FIG. 3B, different from the embodiment of the mixer 130-1, herein the mixer 130-2 further includes a switch circuit 135 to form a single-balanced mixer.

The switch circuit 135 includes a transistor T3. A control terminal (for example, a gate) of the transistor T3 is configured to receive an input signal IS4. A first end (for example, a source) of the transistor T3 is coupled to an output terminal of a switch circuit 131, and a second end (for example, a drain) of the transistor T3 is used as an output terminal (optionally coupled to a choke (CH)) of the switch circuit 135. The input signal IS4 could be a clock signal or a local oscillation signal. The switch circuit 135 is controlled by the input signal IS4 to change a conducting state. For example, the switch circuit 135 could be turned on or turned off, so that one of a control signal CS1 and a control signal CS2 is passed or is blocked, thereby achieving mixing. The switch circuit 135 could mix (for example, being operated in a mixing mode) the control signal CS1 outputted by the switch circuit 131 with the input signal IS4, or mix the control signal CS2 with the input signal IS4, to form an output signal OS2 which is different from the output signal OS1.

In an embodiment, the input signal IS4 is an inverted signal of an input signal IS2. If a switch circuit 133 receives the control signal CS2 (for example, an alternating current signal having a specific periodic characteristic), a carrier frequency of the output signal OS2 is a difference between a carrier frequency of the control signal CS2 and a carrier frequency of the input signal IS2. In other embodiments, the input signal IS4 and the input signal IS2 could also have different frequencies.

In another embodiment, if the switch circuit 131 receives the control signal CS1 in a direct current form, the mixer 130-2 could be used as a differential amplifier, that is, having a buffering function (for example, being operated in a buffering mode), and the output signals OS1 and OS2 are related to a voltage difference between the input signal IS2 and the input signal IS4.

The foregoing embodiments are related to single mixer structures. However, there are also other variations of the multi-mode processing circuit 100.

Figure 4:
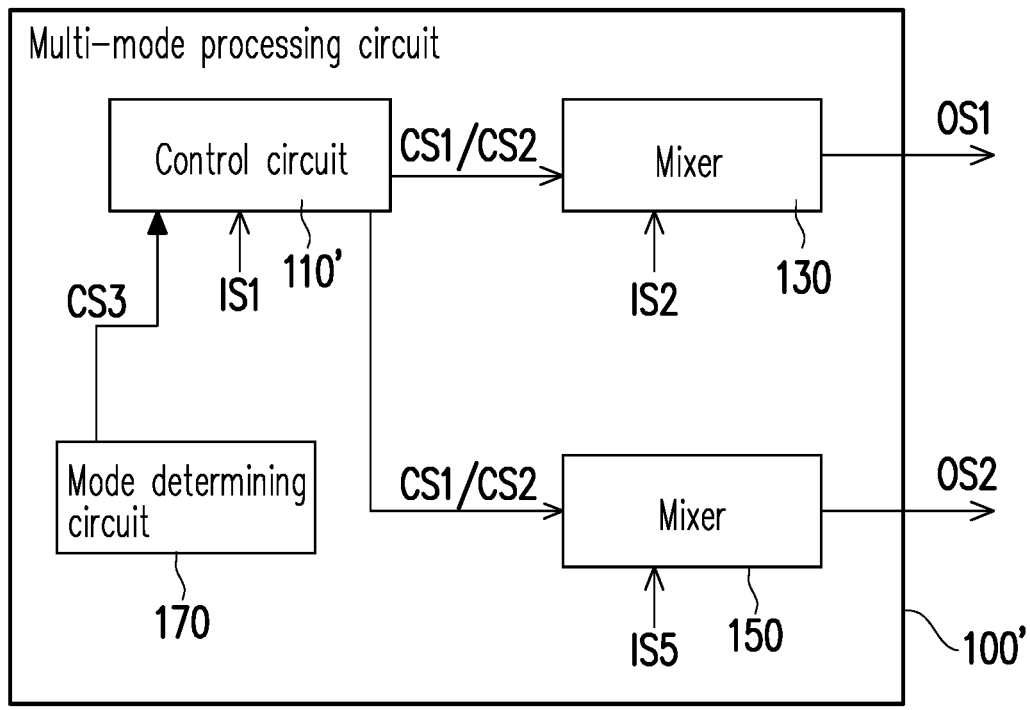
FIG. 4 is a block diagram of elements of a multi-mode processing circuit according to another embodiment of the invention.

FIG. 4 is a block diagram of elements of a multi-mode processing circuit 100' according to another embodiment of the invention. Referring to FIG. 4, different from the embodiment of the multi-mode processing circuit 100, the multi-mode processing circuit 100' further includes another mixer 150 (coupled to a control circuit 110'), and the control circuit 110' provides two output terminals to respectively output one of a control signal CS1 and a control signal CS2 to a mixer 130 and to a mixer 150.

Figure 5:
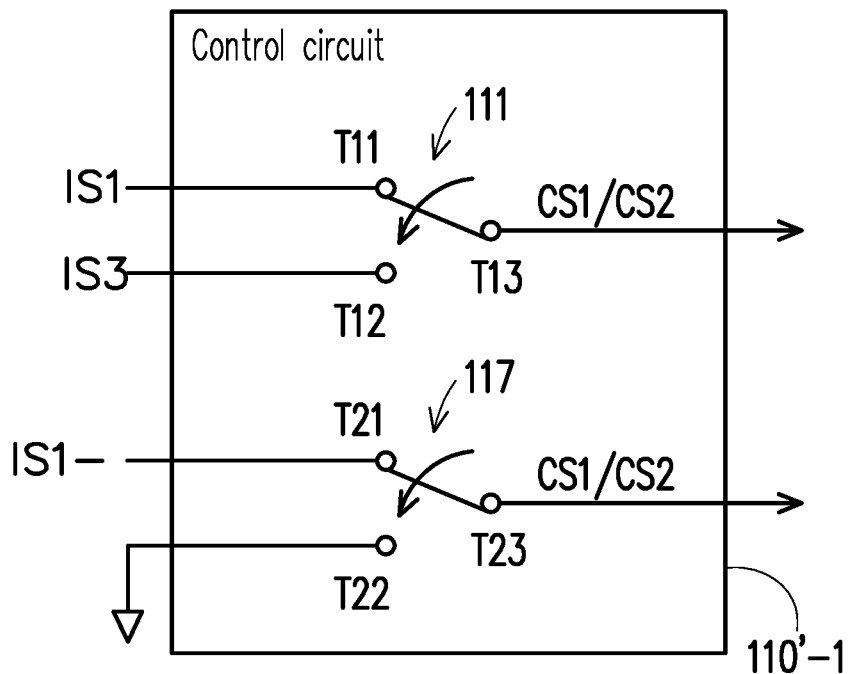
FIG. 5 is a block diagram of elements of a control circuit according to an embodiment of the invention.

There are many variations of the control circuit 110'. FIG. 5 is a block diagram of elements of a control circuit 110'-1 according to an embodiment of the invention. Referring to FIG. 5, different from the embodiment of the control circuit 110-1, the control circuit 110'-1 further includes a control switch 117. An input terminal T21 of the control switch 117 is configured to receive an inverted signal of the input signal IS1 (wherein the said inverted signal is represented by an input signal IS1−), an input terminal T22 of the control switch 117 is grounded, and an output terminal T23 of the control switch 117 is coupled to a mixer 150 and configured to output a control signal CS1 or a control signal CS2. In other words, the control circuit 110'-1 includes two output terminals T13 and T23.

Similarly, the control circuit 110'-1 could be further connected to a control terminal (not shown). The control terminal receives a corresponding control signal (related to selection from the input signals IS1, IS1−, an input signal IS3 and a potential of a reference potential terminal, for example, grounding) in response to the foregoing mode selection operation, so as to select the input signal IS1 as an output of a mixer 130 while selecting the input signal IS1− as an output (that is, outputting the control signal CS2) of the mixer 150, or, select the input signal IS3 as an output of a mixer 130 while selecting no output for the mixer 150, or, select a 0 potential (that is, outputting the control signal CS1).

For example, Table (2) is a comparison table between an output voltage and a mode of the control circuit 110'-1:

TABLE 2

| Output terminal T23 | Output terminal T13 | Mode |
|---|---|---|
| Grounded | VDD | Buffering |
| − | + | Mixing |
| Same potential | | No output |
| + | − | Mixing |

If the output terminal T23 is grounded and the output terminal T13 outputs a power supply voltage VDD (that is, the input signal IS3 or possibly other fixed voltages), the power supply voltage VDD (that is, the direct-current control signal CS1) is output. If the output terminal T23 outputs the input signal IS1−, and the output terminal T13 outputs the input signal IS1, the output signal then is the control signal CS2 (an amplitude in an alternating current form could be a positive value or a negative value). Alternatively, if the output terminals T13 and T23 output signals of a same potential, the direct-current control signal CS1 is output.

In another embodiment, the control circuit 110' could be a control circuit 110-2 in the embodiment shown in FIG. 2B. The comparison table in Table (1) is used as an example. An output terminal 1 could be coupled to the mixer 150, and an output terminal 2 could be coupled to the mixer 130.

Figure 6:
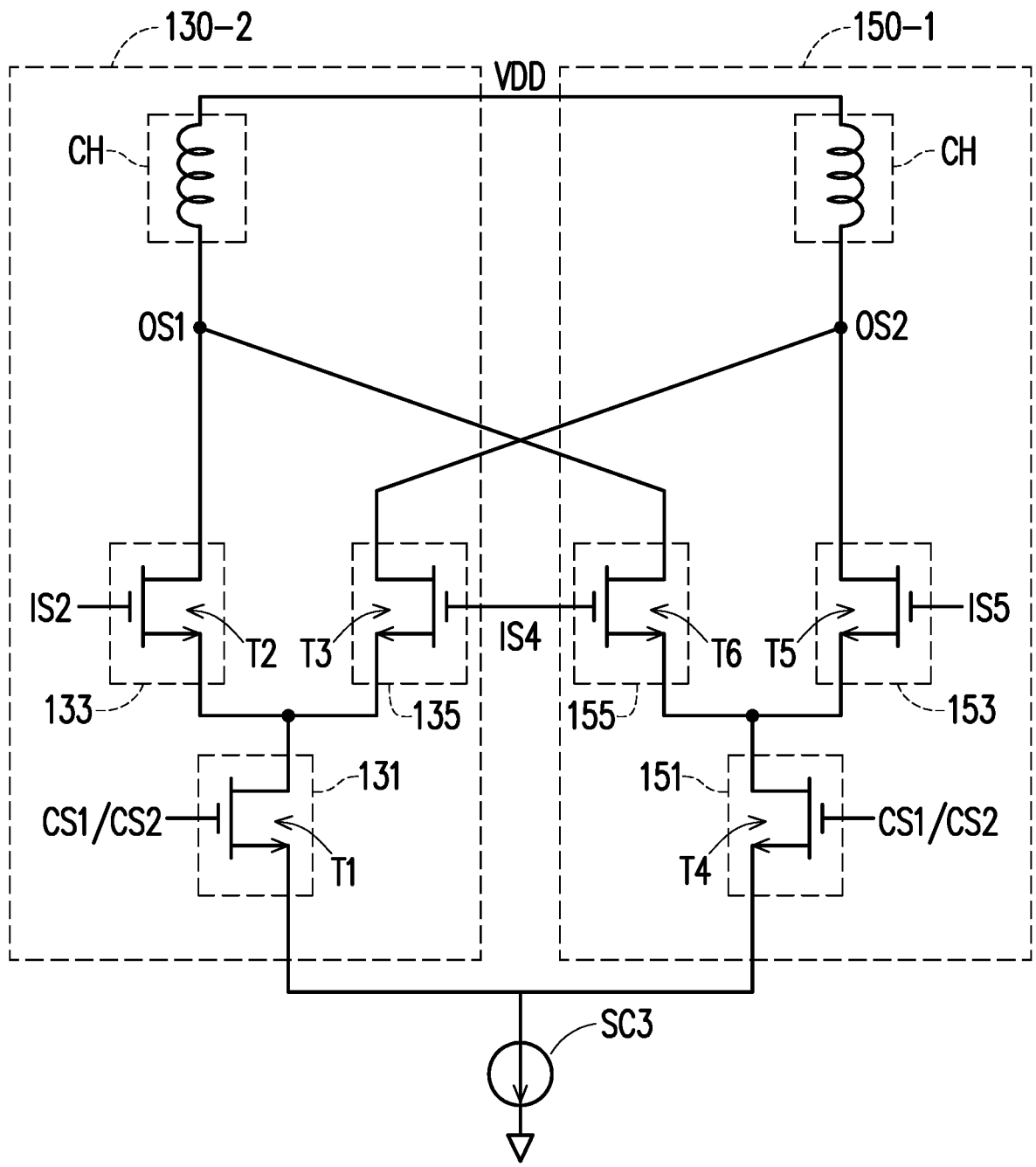
FIG. 6 is a block diagram of elements of a mixer according to still another embodiment of the invention.

In addition, FIG. 6 is a block diagram of elements of a mixer 130 and a mixer 150 according to still another embodiment of the invention. Referring to FIG. 6, for example, the mixer 130 could be the mixer 130-2 in the embodiment of FIG. 3B. However, for other embodiments, the mixer 130 could be the mixer 130-1 in FIG. 3A or other mixers, and the detailed descriptions thereof are omitted herein. However, another mixer 150-1 includes a switch circuit 151, a switch circuit 153, and a switch circuit 155, and, the mixer 150-1 with the mixer 130-2 jointly form a double-balanced mixer (for example, a Gilbert cell).

The switch circuit 151 includes a transistor T4. A control terminal (for example, a gate) of the transistor T4 is coupled to an output terminal (for example, the output terminal T23 in FIG. 5 or the output terminal 1 in Table (1)) of a control circuit 110, and, the said control terminal is configured to receive a control signal CS1 or a control signal CS2. A first end (for example, a source) of the transistor T4 is coupled to a current source SC3 (wherein the other end of the current source SC3 is grounded), and a second end (for example, a drain) of the transistor T4 is used as an output terminal of the switch circuit 151. The switch circuit 151 is controlled by one of the control signal CS1 or the control signal CS2, to thereby be turned on or turned off, so that one of the control signal CS1 and the control signal CS2 is output or blocked.

The switch circuit 153 includes a transistor T5. A control terminal (for example, a gate) of the transistor T5 is configured to receive an input signal IS5. A first end (for example, a source) of the transistor T5 is coupled to the output terminal of the switch circuit 151, and a second end (for example, a drain) of the transistor T5 is used as an output terminal (which could be optionally coupled to a choke (CH)) of the switch circuit 153. The switch circuit 153 is controlled by the input signal IS5 to be turned on or turned off accordingly, so that one of the control signal CS1 and the control signal CS2 passes or is blocked, thereby achieving mixing. The switch circuit 153 could mix (for example, being operated in a mixing mode) the control signal CS1 output by the switch circuit 151 with the input signal IS5, or mix the control signal CS2 with the input signal IS5, to form an output signal OS2.

In an embodiment, a carrier frequency of the input signal IS5 is the same as a carrier frequency of an input signal IS2. For example, the input signal IS5 is the input signal IS2. If the switch circuit 153 receives an inverted signal of the control signal CS2 (for example, an alternating current signal having a specific periodic characteristic), a carrier frequency of the output signal OS2 would be a difference (that is, a sum of carrier frequencies of the inverted control signal CS2 and the input signal IS5) between the carrier frequencies of the control signal CS2 and the input signal IS2.

The switch circuit 155 includes a transistor T6. A control terminal (for example, a gate) of the transistor T6 is configured to receive an input signal IS4. A first end (for example, a source) of the transistor T6 is coupled to the output terminal of the switch circuit 151, and a second end (for example, a drain) of the transistor T6 is used as an output terminal (which could be optionally coupled to a choke (CH)) of the switch circuit 155. The input signal IS4 could be a clock signal or a local oscillation signal. The switch circuit 155 is controlled by the input signal IS4 to change a conducting state. For example, the switch circuit 155 could be turned on or turned off, so that one of the control signal CS1 and the control signal CS2 passes or is blocked, thereby achieving mixing. The switch circuit 155 could mix (for example, being operated in a mixing mode) the control signal CS1 output by the switch circuit 151 with the input signal IS4, or, mix the control signal CS2 with the input signal IS4, to form an output signal OS1 (assuming that the input signal IS4 is an inverted signal of the input signal IS2).

In an embodiment, if the switch circuit 151 receives the control signal CS1 in a direct current form, the mixer 150-1 could be used as a differential amplifier, that is, with a buffering function (for example, being operated in a buffering mode), and the output signals OS1 and OS2 are related to a voltage difference between the input signals IS4 and IS5.

It should be noted that, in another embodiment, the mixer 150 could also not include the switch circuit 155 (that is, the mixer 150 includes only the switch circuits 151 and 153), and for related description, reference may be made to description of the mixer 130-1 in FIG. 3A, and the further descriptions thereof are omitted herein.

In addition, referring to FIG. 4, in an embodiment, the multi-mode processing circuit 100' further includes a mode determining circuit 170. The mode determining circuit 170 is coupled to the control circuit 110' (for example, the control terminal of the control circuit 110'). The mode determining circuit 170 outputs a control signal CS3, and the control circuit 110' could select output of one of the control signal CS1 and the control signal CS2 based on the control signal CS3.

In an embodiment, the control signal CS3 determines, based on a detection result, that the control circuit 110' provides one of the control signal CS1 and the control signal CS2, and the detection result is detected based on an output signal OS1. In particular, an output terminal of the mixer 130 could be connected to a radio frequency (RF) front-end circuit (not shown, for example, a power amplifier (PA) and an antenna), to transmit the output signal OS1 and/or an output signal OS2. A receiver could receive a reflection signal of the output signal OS1 and/or the output signal OS2, and determine, according to a reference distance, whether there is an analysis result of a moving object. The mode determining circuit 170 could thereby provide the control signal CS3 based on the analysis result. For example, if the control signal CS3 has a high potential, it could indicate that there is a moving object, and a low potential indicate that there is no moving object.

In another embodiment, the control signal CS3 could also be generated based on a user's input operation, time adjustment or other analysis results.

It may be learned from the foregoing description that the mixers 130 and 150 in the embodiment of the invention integrates with a buffer to form a single unit, and could form one of the mixer and the buffer by inputting different control signals CS1 and CS2. Operation thereof will be detailed described below. For convenience of description, the embodiments in FIG. 4 and FIG. 6 will be mainly described below. However, other embodiments may also be implemented.

Figure 7:
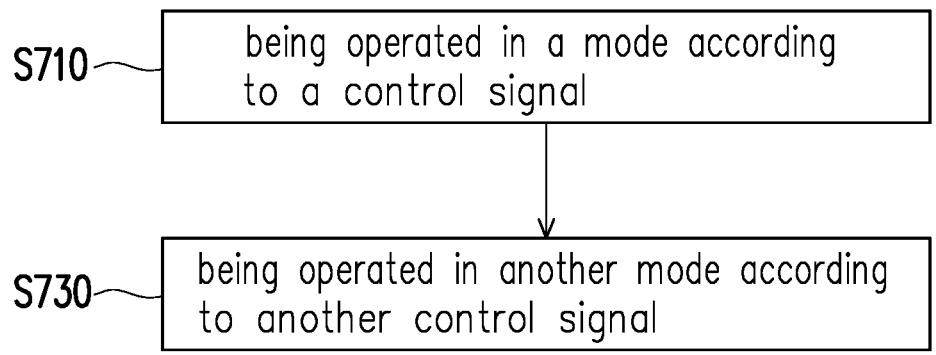
FIG. 7 is a flowchart of a multi-mode controlling method according to an embodiment of the invention.

FIG. 7 is a flowchart of a multi-mode controlling method according to an embodiment of the invention. Referring to FIG. 7, a multi-mode processing circuit 100' is operated in a mode according to a control signal CS1 (step S710). In an embodiment, the control signal CS1 is a direct current signal. The control circuit 110'-1 in Table (2) and FIG. 5 is used as an example. An output terminal T13 of a control switch 111 is connected to an input terminal T12, an output terminal T23 of a control switch 117 is connected to an input terminal T22, and the corresponding mode is a buffering mode. Or, the control circuit 110-2 in Table (1) and FIG. 2B is used as an example, coded content is "00", and it is assumed that the power supply voltage VDD is 1.2 volts.

It should be noted that, referring to FIG. 6, a voltage of a switch circuit 131 of the mixer 130-2 is the power supply voltage VDD, and a voltage of an output terminal of a switch circuit 133 is the power supply voltage VDD, so that the mixer 130-2 has no output. In addition, a voltage of the switch circuit 151 of the mixer 150-1 is a voltage level of the voltage of a reference potential terminal, for example, 0 volt, and a voltage of an output terminal of the switch circuit 153 is the power supply voltage VDD, so that the mixer 150-1 is used as a differential amplifier, that is, with a buffering function. In the buffering mode, the multi-mode processing circuit 100' could provide a 1-continuous wave (CW) signal (for example, output signals OS1 and OS2 as radar signals) and could be configured object movement detection.

In another embodiment, if the mixer 130-2 and the mixer 150-1 receive signals (for example, the coded content in Table (1) being "10", or the same potential in Table (2)) of a same voltage level. In this case, a differential pair formed by the switch circuits 131 and 151 would subtract the two voltage levels to obtain a 0 voltage level, and cause both the mixer 130-2 and the mixer 150-1 to have no output (hereinafter referred to as a no-output mode).

Figure 8:
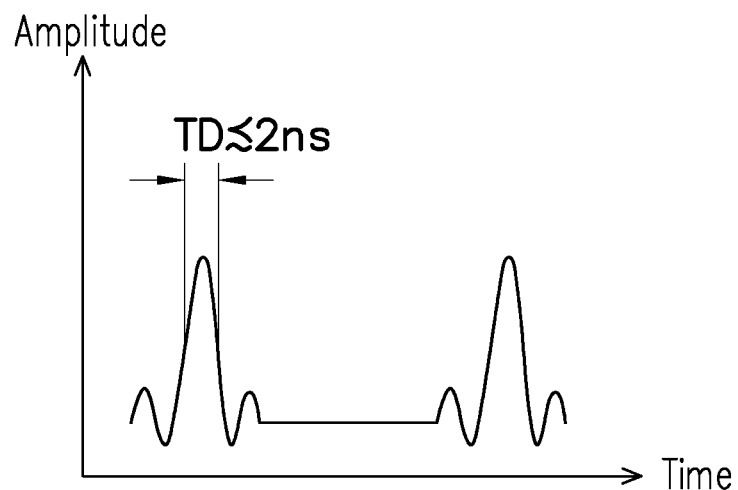
FIG. 8 is a waveform diagram of a short pulse signal according to an embodiment of the invention.

In an embodiment, the buffering mode in combination with the no-output mode could be applied in an ultra-wideband (UWB) application. In particular, FIG. 8 is a waveform diagram of a short pulse signal according to an embodiment of the invention. Referring to FIG. 8, a multi-mode processing circuit 100' switches to a buffering mode in time duration (TD), and then switches to a no-output mode when the time duration (TD) ends. Assuming that a value of the time duration (TD) is less than a specific threshold value (for example, less than or about 2 nanoseconds (ns)), output signals OS1 and/or OS2 will be formed as a flat spread spectrum signal in a spectrum and could be used in the UWB application for distance and position determination.

Referring to FIG. 7, a multi-mode processing circuit 100' is operated in another mode according to a control signal CS2 (step S730). In an embodiment, the control signal CS2 is an alternating current signal. The control circuit 110'-1 in Table (2) and FIG. 5 is used as an example. An output terminal T13 of a control switch 111 is connected to an input terminal T11, an output terminal T23 of a control switch 117 is connected to an input terminal T21, and the mode herein is a mixing mode. Or; the control circuit 110-2 in Table (1) and FIG. 2B is used as an example, and coded content is "01" or "11". It should be noted that, referring to FIG. 6, the input signals IS1 and IS1− in an alternating current form would dynamically change conducting states of the switch circuits 131 and 151, for example, turning on or turning off the switch circuits 131 and 151, and, while combining with a time pulse or an input of a local oscillation signal, a mixing function could thereby be achieved.

Figure 9A:
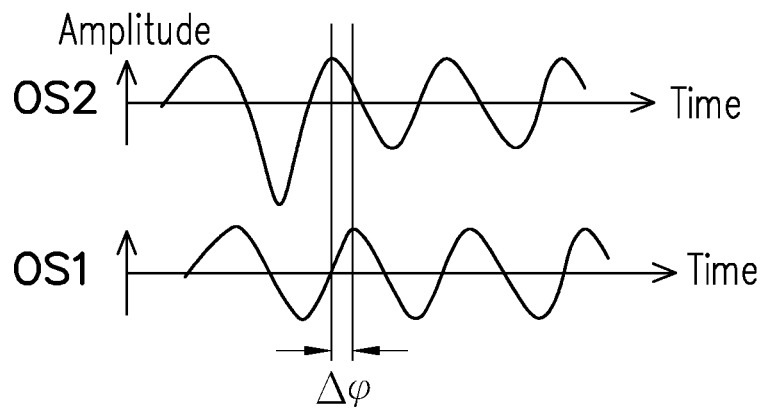
FIG. 9A is a waveform diagram of a 2-continuous wave (CW) application according to an embodiment of the invention.

In a mixing mode, the multi-mode processing circuit 100' could provide a 2-CW signal (for example, an output signal OS1 and an output signal OS2 being used as radar signals) and could be used for distance detection (for example, short-range narrow-frequency distance estimation) for a moving object. In particular, FIG. 6 is used as an example. Assuming that the control signal CS2 received by the mixer 130-2 is an intermediate signal, and a control signal received by the mixer 150-1 is an inverted intermediate signal. FIG. 9A is a waveform diagram of 2-CW application according to an embodiment of the invention. Referring to FIG. 9A, it is assumed that signal waveforms of an output signal OS1 and an output signal OS2 are shown in the figure. A frequency f1 of the output signal OS1 is a sum of carrier frequencies of a local oscillation signal fix) and an intermediate frequency signal $f_{IF}$ (that is, $f_1=f_{LO}+f_{IF}$), and, a frequency $f_2$ of the output signal OS2 is a sum of carrier frequencies of the local oscillation signal fix) and an inverted intermediate frequency signal $f_{-IF}$ (that is, $f_2=F_{LO}-f_{IF}$).

It should be noted that, based on a Doppler shift, a signal propagation distance is related to a change of a phase. Assuming that the output signal OS1 and the output signal OS2 are transmitted through a radio frequency front-end circuit, after the two transmission signals with different carrier frequencies are reflected by a moving object and then are received by a receiver, a phase difference Δφ between the two transmission signals would relate to a relative distance of the moving object.

Figure 9B:
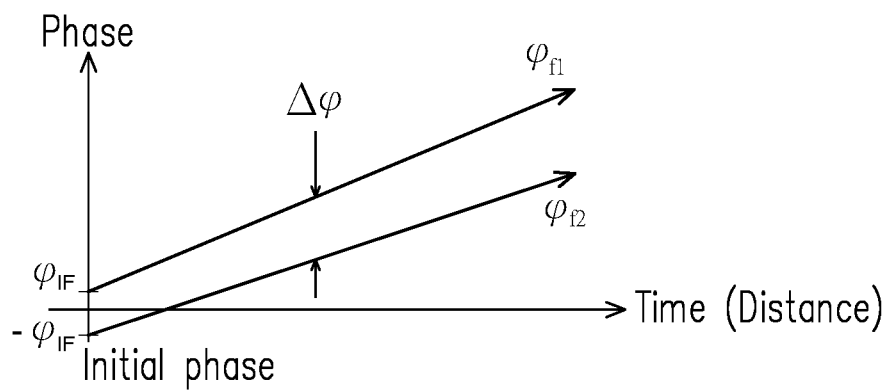
FIG. 9B is a diagram of a phase-time (distance) correspondence of a 2-CW application according to an embodiment of the invention.

FIG. 9B is a diagram of a phase-time (distance) correspondence of a 2-CW application according to an embodiment of the invention. Referring to FIG. 9B, a phase $\varphi_{f1}$ corresponds to a phase of an output signal OS1 (for example, a sum of a phase $\varphi_{LO}$ of a local oscillation signal and a phase $\varphi_{IF}$ of an intermediate frequency signal, that is, $\varphi_{f1}=\varphi_{LO}+\varphi_{IF}$), and, a phase $\varphi_{f2}$ corresponds to a phase of an output signal OS2 (for example, a difference between the phase $\varphi_{LO}$ of the local oscillation signal and the phase $\varphi_{IF}$ of the intermediate frequency signal, that is, $\varphi_{f2}=(\varphi_{LO}-\varphi_{IF})$. A phase difference Δφ is a difference between two phases $\varphi_{f1}$ and $\varphi_{f2}$ (that is, $\Delta\varphi=(\varphi_{f1}-\varphi_{f2})$. It should be noted that because a mixer 130 and a mixer 150 could synchronously input the local oscillation signal, and could provide a synchronous initial reference phase between the output signal OS1 and the output signal OS2. Since the initial reference phase could be synchronized, a distance estimation result corresponding to the phase difference Δφ thereby could also be relatively better accurate.

In an embodiment, if a detection result (that is, the foregoing analysis result) based on a mode of a control signal CS1 (that is, using 1-CW dynamic detection) is that, a moving object appears, a mode determining circuit 170 then could generate a control signal CS3 that drives a control circuit 110 to thereby provide a control signal CS2, that is, it is switched to a control signal CS2-based mode (that is, using 2-CW distance detection for the moving object). On the other hand, if the detection result based on the mode of the control signal CS1 is that the moving object does not appear, a multi-mode processing circuit 100' then would keep in the current mode. Because the 1-CW dynamic detection is more power-saving than the 2-CW distance detection, through the foregoing switching mechanism, the multi-mode processing circuit 100' could be switched to a mode of the 2-CW distance detection when there is a distance detection demand (for example, the moving object appears), since the multi-mode processing circuit is unnecessary to keep in the mode of the 2-CW distance detection at any time, energy thereby is saved.

In addition, the mixer 130 and the mixer 150 in the embodiments of the invention are current driven (as shown in FIG. 3A, FIG. 3B and FIG. 6), and a fast switching mode could be achieved by changing voltage levels of the input signals IS1 and IS1−, or by changing digital coded content.

Based on the foregoing descriptions, according to the multi-mode processing circuit and the multi-mode controlling method thereof in the embodiments of the invention, the buffer and the mixer could be integrated, for example, the buffer and the mixer could be integrated in a single cell, so as to save both wiring area and power consumption. In addition, different control signals are input in the embodiment of the present invention, to implement the mode switching and reduce insertion losses. In radar application, the embodiments of the invention could provide detections or estimations of a 1-CW mode, a 2-CW mode, and a short pulse mode. In a case of current-driven switch, the embodiments of the invention could implement fast mode switch. In addition, for the 2-CW distance detection, the synchronous initial reference phase could be provided, so as to improve accuracy of distance estimation.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A multi-mode processing circuit, comprising:
a control circuit, configured to receive a first input signal and output one of a first control signal and a second control signal according to the first input signal, wherein the first control signal is a direct current signal; and
a mixer, coupled to the control circuit and configured to mix the first control signal output by the control circuit with a second input signal or mix the second control signal output by the control circuit with the second input signal to output a first output signal.

2. The multi-mode processing circuit according to claim 1, wherein the control circuit comprises:
a first control switch, comprising:
a first input terminal configured to receive the first input signal;
a second input terminal configured to receive a third input signal; and
an output terminal, coupled to the mixer, and configured to output the first control signal or the second control signal, wherein
the first control switch selects the first input signal as the first control signal to be output or selects the third input signal as the second control signal to be output.

3. The multi-mode processing circuit according to claim 1, wherein the control circuit comprises:
a digital-to-analog converter (DAC), outputting one of the first control signal and the second control signal based on coded content of the first input signal.

4. The multi-mode processing circuit according to claim 1, wherein the mixer comprises:
a first switch circuit, coupled to the control circuit, and controlled by one of the first control signal and the second control signal, so that one of the first control signal and the second control signal is output or is blocked; and
a second switch circuit, coupled to the first switch circuit, and controlled by the second input signal, and mixing the first control signal output by the first switch circuit with the second input signal or mixing the second control signal output by the first switch circuit with the second input signal, to form the first output signal.

5. The multi-mode processing circuit according to claim 4, wherein
in response to receiving the first control signal, a carrier frequency of the first output signal output by the second switch circuit is a sum of carrier frequencies of the first control signal and the second input signal; and
in response to receiving the second control signal, the carrier frequency of the first output signal output by the second switch circuit is a sum of carrier frequencies of the second control signal and the second input signal.

6. The multi-mode processing circuit according to claim 5, wherein the second control signal is an alternating current signal.

7. The multi-mode processing circuit according to claim 4, wherein the mixer further comprises:
a third switch circuit, coupled to the first switch circuit, receiving a fourth input signal, controlled by the fourth input signal, and mixing the first control signal output by the first switch circuit with the fourth input signal or mixing the second control signal output by the first switch circuit with the fourth input signal to form a second output signal which is different from the first output signal.

8. The multi-mode processing circuit according to claim 1, further comprising:
a second mixer, coupled to the control circuit, and configured to mix the first control signal output by the control circuit with a fifth input signal or mix the second control signal output by the control circuit with the fifth input signal to output a third output signal which is different from the first output signal.

9. The multi-mode processing circuit according to claim 8, wherein the mixer is coupled to a first output terminal of the control circuit, the second mixer is coupled to a second output terminal of the control circuit, and the first output terminal and the second output terminal jointly output one of the first control signal and the second control signal.

10. The multi-mode processing circuit according to claim 9, wherein
in response to receiving the second control signal, a carrier frequency of the third output signal output by the second mixer is a sum of carrier frequencies of the inverted second control signal and the fifth input signal.

11. The multi-mode processing circuit according to claim 9, wherein a carrier frequency of the fifth input signal is identical to a carrier frequency of the second input signal.

12. The multi-mode processing circuit according to claim 8, wherein the control circuit comprises:
a second control switch, comprising:
a third input terminal, configured to receive the first input signal which is inverted;
a fourth input terminal, configured to be coupled to a reference voltage terminal; and
a second output terminal, coupled to the second mixer, and configured to output the first control signal or the second control signal, wherein
the second control switch selects no output, or selects the first input signal which is inverted, as the second control signal, to be output.

13. The multi-mode processing circuit according to claim 8, wherein the second mixer comprises:
a fourth switch circuit, coupled to the control circuit, and controlled by one of the first control signal and the second control signal, so that one of the first control signal and the second control signal is output or is blocked;
a fifth switch circuit, coupled to the fourth switch circuit, controlled by the fifth input signal, and mixing the first control signal output by the fourth switch circuit with the fifth input signal or mixing the second control signal with the fifth input signal to form the third output signal; and
a sixth switch circuit, coupled to the fourth switch circuit, receiving a sixth input signal, controlled by the sixth input signal, and mixing the first control signal output by the fourth switch circuit with the sixth input signal or mixing the second control signal with the sixth input signal, to form a fourth output signal which is different from the third output signal.

14. The multi-mode processing circuit according to claim 1, further comprising:
a choke, an end of the choke being coupled to an output terminal of the mixer, and an another end of the choke receiving a sixth input signal; and
a current source, an end of the current source being coupled to the mixer, and an another end of the current source being configured to be coupled to a reference voltage terminal.

15. The multi-mode processing circuit according to claim 1, further comprising:
a mode determining circuit, coupled to the control circuit, and determining, according to a detection result, that the control circuit provides one of the first control signal and the second control signal, wherein the detection result is detected based on the first output signal.

16. A multi-mode controlling method, comprising:
providing a multi-mode processing circuit according to claim 1;
being operated in a first mode according to the first control signal; and
being operated in a second mode according to the second control signal, wherein the second mode is different from the first mode.

17. The multi-mode controlling method according to claim 16, wherein the first mode is used for object movement detection or the second mode is used for distance detection of a moving object.

18. The multi-mode controlling method according to claim 17, further comprising:
in response to that a detection result in the first mode is that a moving object appears, switching to the second mode, wherein the second mode is used for distance detection of the moving object.

19. The multi-mode controlling method according to claim 16, wherein the step of being operated in the second mode according to the second control signal comprises:
providing a first switch circuit controlled by one of the first control signal and the second control signal, so that one of the first control signal and the second control signal is output or is blocked;
providing a second switch circuit controlled by the second input signal, wherein the second switch circuit mixes the first control signal output by the first switch circuit with the second input signal or mixes the second control signal output by the first switch circuit with the second input signal, to form the first output signal;
providing a third switch circuit, wherein the third switch circuit receives a third input signal, the third switch circuit is controlled by the third input signal, and the third switch circuit mixes the first control signal output by the first switch circuit with the third input signal or mixes the second control signal output by the first switch circuit with the third input signal to form a second output signal which is different from the first output signal; and
providing a synchronous initial reference phase between the first output signal and the second output signal.

20. The multi-mode controlling method according to claim 16, wherein the step of being operated in the second mode according to the second control signal comprises:
providing a second mixer, wherein the second mixer is configured to mix the first control signal output by the control circuit with a fourth input signal or mix the second control signal output by the control circuit with the fourth input signal to output a third output signal which is different from the first output signal; and
providing a synchronous initial reference phase between the first output signal and the third output signal.

* * * * *